United States Patent [19]

Gupta et al.

[11] Patent Number: 5,731,985
[45] Date of Patent: Mar. 24, 1998

[54] CHIP SIZING FOR HIERARCHICAL DESIGNS

[75] Inventors: Rajesh Gupta, Poughkeepsie; John Youssef Sayah, North Tarrytown, both of N.Y.

[73] Assignee: International Business Machines Corporation, Armonk, N.Y.

[21] Appl. No.: 631,113

[22] Filed: Apr. 23, 1996

[51] Int. Cl.$^6$ .................................................. G06F 17/50
[52] U.S. Cl. .................................................. 364/491
[58] Field of Search ........................ 364/488, 489, 364/490, 491

[56] References Cited

U.S. PATENT DOCUMENTS

| | | | |
|---|---|---|---|
| 4,577,276 | 3/1986 | Dunlop et al. | 364/491 |
| 4,918,614 | 4/1990 | Modarres et al. | 364/490 |
| 5,095,356 | 3/1992 | Ando et al. | 357/45 |
| 5,146,343 | 9/1992 | Fujii | 358/296 |
| 5,187,668 | 2/1993 | Okude et al. | 364/468 |
| 5,208,759 | 5/1993 | Wong | 364/468 |
| 5,398,195 | 3/1995 | Kim | 364/491 |
| 5,416,722 | 5/1995 | Edwards | 364/491 |
| 5,418,733 | 5/1995 | Kamijima | 364/490 |
| 5,420,800 | 5/1995 | Fukui | 364/491 |

OTHER PUBLICATIONS

A. R. Bruss, et al., "Flexible Image for Physical Layout of Circuits", IBM Technical Disclosure Bulletin, vol. 27, No. 11, Apr. 1985, pp. 6687–6691.

*Primary Examiner*—Kevin J. Teska
*Assistant Examiner*—Leigh Marie Garbowski
*Attorney, Agent, or Firm*—Alison D. Mortinger

[57] ABSTRACT

A method for resizing the macro cells' boundaries of an integrated chip is disclosed and that becomes effectual after the initial floorplanning process has been completed. The method of the present invention apportions any excess area that is freed-up after the initial floorplanning process by altering the sizes or dimensions of the macro cell within the hierarchy of the integrated circuit in such a manner that the fractional change in the percentage occupancy is substantially constant among all macro cells at all hierarchy levels.

14 Claims, 6 Drawing Sheets

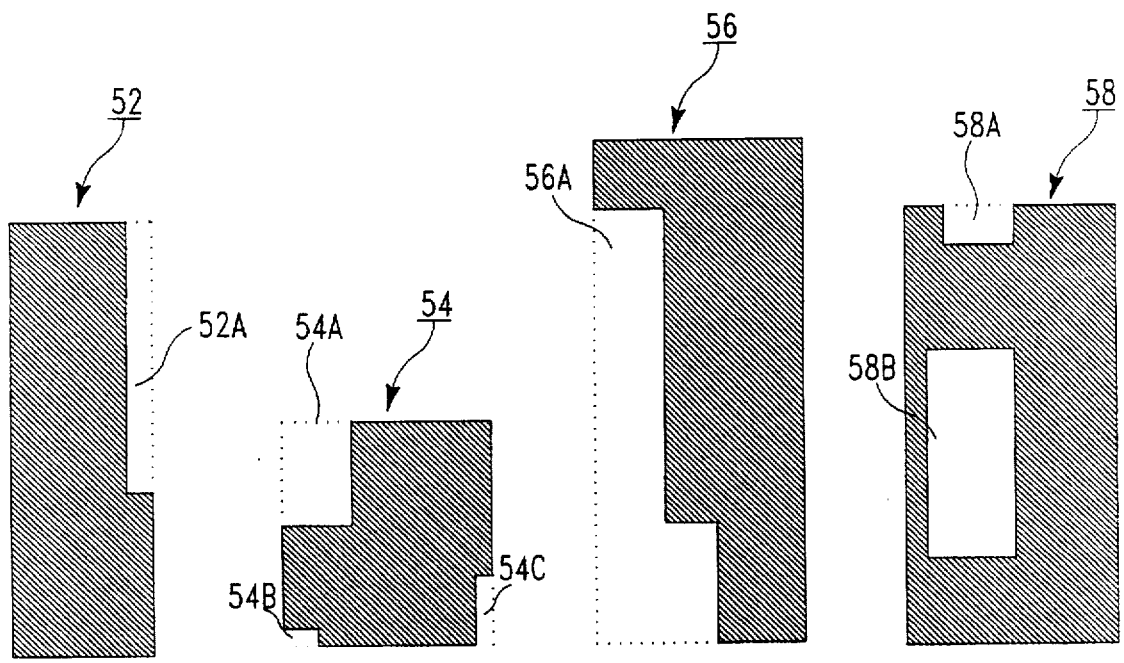
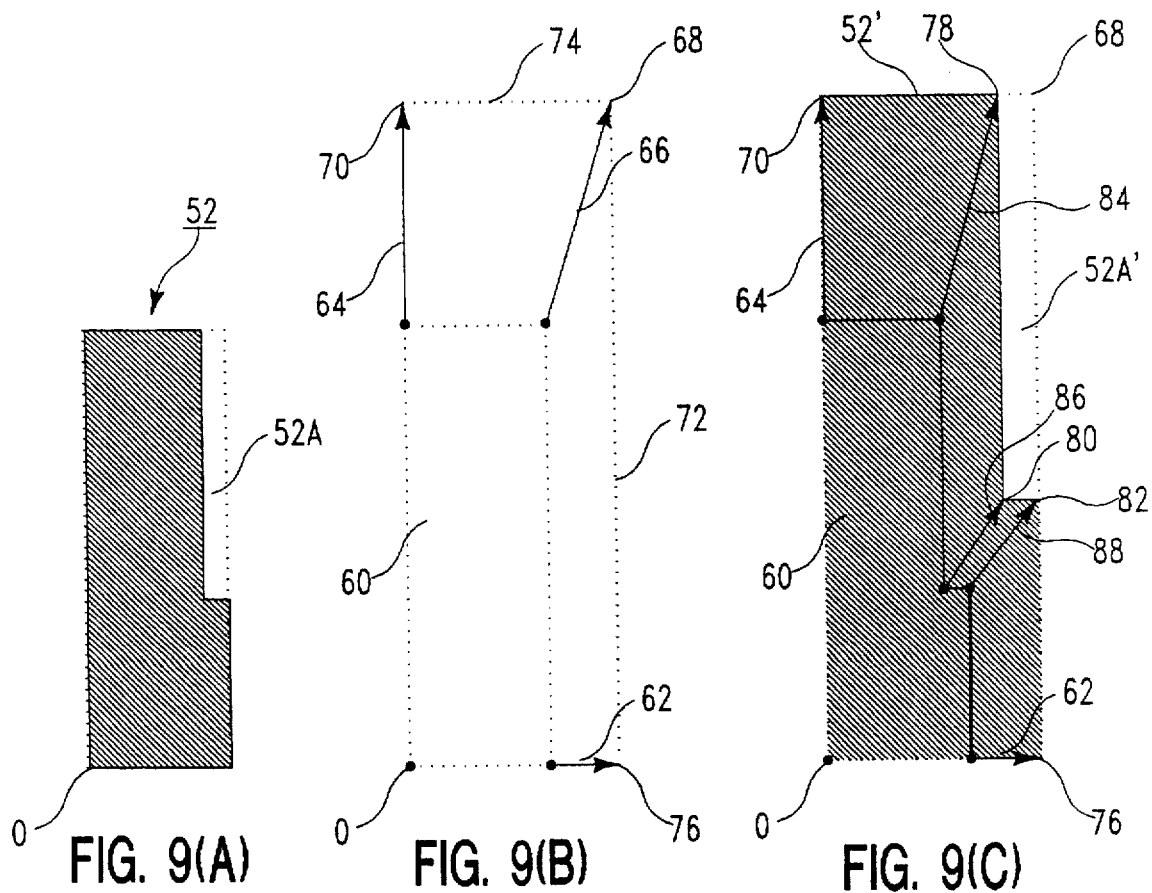

CHIP SIZING FOR HIERARCHICAL DESIGNS

FIELD OF THE INVENTION

This invention relates to the placement of interconnected functional devices in an integrated circuit chip and, more particularly, to a method of apportioning additional space in an integrated circuit so that all of the hierarchical levels and their interconnected functional devices have substantially the same decrease in percentage occupancy factor.

BACKGROUND OF THE INVENTION

Typically, the percentage occupancy factor, which is representative of the amount of space or area utilized by functional devices at each level of an integrated circuit chip, is established by a floorplanning process. Floorplanning processes are known in the art and one such process is described in U.S. Pat. No. 4,918,614 issued Apr. 17, 1990 and herein incorporated by reference. Floorplanning is a process for placing functional devices ("functions," may also be termed modules, elements, blocks, functional blocks, macro cells and library cells) on a chip and allocating interconnection space among them, so as to minimize the actual chip area required to encompass such functions and their interconnections, and to maximize the probability that such interconnections can be routed within the area. A functional device commonly consists of a discrete logic and/or memory element, or any combination of any such elements.

Prior to the floorplanning process itself, the chip's logic must be designed. Logic designers generally employ hierarchical design techniques to determine the appropriate selection and interconnection of logic and/or memory devices which enable the chip to perform its overall desired function. One such hierarchical design may be described with reference to FIG. 1 associated with a chip 10.

FIG. 1 illustrates an example of a logical hierarchy in which the chip 10 itself constitutes level 1 of the hierarchy, while its children, A, B, C, D and E constitute level 2. Level 3 contains the children of A (A1, A2 and A3), the children of C (C1 and C2) and the children of E (E1 and E2). Each child cell of a parent cell is commonly referred to as a macro cell. The children of E may also include E3, which as shown in FIG. 1, in phantom, shares the same hierarchy (level 3) as C11 which, in turn, have children C111 and C112 at level 4. Level 4 also contains the children of C1 (C11 and C12), the children of E2 (E21 and E22). Level 5 contains the children of C11 (C111 and C112), the children of E22 (E221 and E222) and also, as shown in FIG. 1, the child E221 of level 5 shares the same level in the hierarchy as C11. Finally, level 6 contains the children of C11 (sharing level 5 with the child E221) C111 and C112. Each of the children A1, A2, A3, C111, C112, E21 and E222, which is not also a parent (i.e., which has no children), is referred to herein as a leaf cell. Further, cells B, D, C2 and E1 which have no children are also leaf cells.

Each of the leaf cells is typically connected to at least one other of the leaf cells, and the connection thereof is commonly referred to as a "net." Furthermore, in some embodiments, a leaf cell may be connected in a hierarchy that eventually leads into and is eventually connected to another leaf cell. A series of nets, each of which defines a plurality of interconnected leaf cells, is commonly referred to as a "net list" which is also illustrated in FIG. 1.

As seen in FIG. 1, with reference to the illustrated net list, net 1, for example, indicates that leaf cells A1, C111, E1 and E22 are interconnected, although the net list does not specify which pairs of such leaf cells are actually connected directly to each other.

As is known in the art, the cost of producing an integrated circuit, such that generally illustrated in FIG. 1, increases with the area of silicon that is utilized therefor. One of the most important goals of chip physical design involved in the production process is to fit a net list of logic elements into the smallest possible chip package or chip image. Application Specific Integrated Circuit (ASIC) design libraries generally offer a discrete set of chip images having predefined sizes and dimensions such as those defined by a seven (7) or eight (8) millimeters (mm) square. These predefined sizes are defined in terms of building blocks which may be further described with reference to FIG. 2.

FIG. 2 is composed of FIG. 2(A), 2(B) and 2(C), wherein FIG. 2(A) illustrates a building block 12 having predefined horizontal and vertical dimensions respectively shown as $\Delta_x$ and $\Delta_y$. The building block 12 has a plurality of elements, such as 12A, 12B, 12C, 12D and 12E, each serving a particular function, such as, an electrically conductive segment or a logic element. FIG. 2(B) illustrates an array 14 composed of ten (10) building blocks 12 arranged so as to have predefined horizontal and vertical dimensions, respectively shown as $5\Delta_x$ and $2\Delta_y$. Similarly, FIG. 2(C) illustrates an array 16 composed of fourteen (14) building blocks 12 arranged so as to have predefined horizontal and vertical dimensions respectively shown as $7\Delta_x$ and $2\Delta_y$. As is known in the art, the elements, such as 12A, 12B, 12C, 12D and 12E, may be configured so that the arrays 14 and 16 each performs a desired circuit operation.

The initial determination of the chip image size requirement by the circuit designer generally takes place early in the chip physical design cycle, such as in the floorplanning process. First, the minimum required area for the net list of logic elements is estimated based primarily on the number and sizes of placeable functional entities in the net list, the number of nets to be wired, the number of wiring planes available in the fabrication technology, and the number of primary input/output ports set out to operatively service the integrated circuit. In actuality, after the minimum required area has been determined, an appropriate chip image size is selected among the available image sizes such that its area is greater than or equal to the required area. If the chip design is "flat," i.e., there is no hierarchical grouping of the cells to be placed on the integrated circuit, in practice the placement is typically accomplished by the chip designer arranging the wiring tools to take advantage of the excess area (actual minus minimum) so as to ease the wiring task of the chip. However, if the chip design is hierarchical, then the excess space needs to be advantageously distributed among the various hierarchical cells which typically and disadvantageously requires an additional design effort in the production cycle.

Another situation where cells in the hierarchy need to be expanded to take advantage of excess area and, thus, adding another design effort, is when the physical design work has already been carried out on the hierarchy, and there becomes a need to move the entire net list of the chip to a larger chip image size, either due to logic changes in the overall integrated circuit chip, or due to a failure in placement of a logic element and/or a failure in its associated wiring. Both of these efforts require expanding the hierarchical area assigned for the placement of elements, and may be further described herein with reference to FIG. 3.

FIG. 3 illustrates an area 18 of a hierarchial cell. The area 18 is defined by X and Y axes respectively representative of the width and height thereof and with each point therein definable by specific coordinates. The illustrated area 18 of FIG. 3 represents the area after it has been sized by an area estimation (floorplanning process or in a pre-floorplanning process) and which needs to be mapped (fitted in) to a chip image. More particularly, and as to be more fully described, the illustrated area 18 is to be increased and that increased area needs to be appropriately distributed, in a substantially equal manner, to accommodate all of the related hierarchical cells.

The area 18 of FIG. 3 includes an outer rectangle 20 representative of the top-level cell. The top-level cell, as well as other cells related to the practice of this invention, may be equally definable by non-rectangular shapes, in a manner as to be described hereinafter. The area 18 further includes inner rectangles 22 and 24, both of which represent macro cells. A plurality of library cells $26_1 \ldots 26_N$ (fixed in size) are located within the macro cell 22 which is relatively large as compared to the smaller macro cell 24. Macro cell 24 has confined therein a plurality of elements $28_1 \ldots 28_N$ that are separated from each other by a predetermined amount 30. Similarly, the plurality of library cells $26_1 \ldots 26_N$ are separated from each other by an amount 32 and occupy an overall area 34 defined by the macro cell 22. The area 18, in a manner as previously described, undergoes an increased resizing so as to become an area 18A shown in FIG. 4 that should be fitted into a new chip image size.

More particularly, as seen in FIG. 4, the outer rectangle of the illustrated area 18A has been increased and is generally represented with the reference nomenclature 20A. A comparison between FIGS. 4 and 3 reveals that the area 20A of FIG. 4 is substantially greater than the area 20 of FIG. 3. This substantial increase is used to more clearly illustrate the principles of the present invention, but in actuality the difference between the two areas may not be of a large amount. A further comparison between FIGS. 3 and 4 reveals that the macro cells 22 and 24, as well as the library cells $26_1 \ldots 26_N$ and the spacing 32 therebetween, have retained their original size and shape. For the hierarchical layout of FIG. 4, the task of floorplanning and wiring this top level of the hierarchy, which may very well correspond to level 1 (chip 10) shown in FIG. 1, is relatively easy because the utilization, that is, the percentage occupancy factor at this level has decreased, relative to FIG. 3, due to the extra available space, however, undesirably, the placement and the wiring task within the macro cells 22 and 24 have not changed in their difficulty because the utilization therein is unchanged. The terms "utilization", "utilization percentage" and "percentage occupancy factor" of a cell at some hierarchical level, may be used herein in an interchangeable manner, but either of such terms refers to the percentage of area of the cell occupied by the child cells or functional elements within the cell. A more equal distribution of the area gained in FIG. 4, as defined by the outer rectangle 20A, may be described with reference to FIG. 5.

A comparison between FIGS. 4 and 5 reveals that both have the same outer area as defined by the same outer rectangle 20A, but FIG. 5 has macro cells 22A and 24A each having an area that is respectively and substantially greater than that of the macro cells 22 and 24 of FIG. 4, and also that of the macro cells 22 and 24 of FIG. 3. More particularly, the spacing 32A of the macro cell 22A between the library cells $26_1 \ldots 26_N$ and the area 34A of macro cell 22A as well as the spacing 30A between the elements $28_1 \ldots 28_N$ of macro cell 24A are respectively and substantially greater than the spacing 32, the area 34, and the spacing 30 all illustrated in both FIGS. 3 and 4.

FIG. 5 illustrates the same hierarchical design of FIGS. 3 and 4 matched to the same image size of FIGS. 3 and 4, but in the case of FIG. 5, the macro cells 22A and 24A have been grown in the same proportion as the chip boundary defined by the outer rectangle 20A of FIG. 5. For the arrangement shown in FIG. 5, the placement and wiring tasks within the hierarchical macro cells, that is, within 22A and 24A are greatly eased because the library cells $26_1 \ldots 26_N$ of macro cell 22A and the elements $28_1 \ldots 28_N$ of macro cell 24A have the same size, relative to those of FIG. 3 and 4, while the macro cells sizes (in particular, their respective area) such as those illustrated for macro cells 22A and 24A, have increased, hence the utilization has decreased and, accordingly, the related placement and wiring tasks have reduced in their complexity. Even though the complexity of the wiring tasks of the macro cells 22A and 24A has advantageously been reduced, the utilization at the top level 18B of FIG. 5 is disadvantageously the same as that of FIG. 3. It is desired that the utilization of the top level of the chip be increased, while at the same time reducing the complexity of the wiring task.

OBJECTS OF THE PRESENT INVENTION

It is a primary object of the present invention to provide a method of apportioning, in a substantially equal manner, any excess space between hierarchical cells of an integrated circuit made available after the floorplanning process.

It is another object of the present invention to alter the sizes of the macro cells within the hierarchy in such a manner that the fractional change in the utilization percentage is substantially constant among all macro cells at all hierarchy levels.

It is a further object of the present invention to provide an easily implemented method so that the substantially equal apportioning of the excessive space for the hierarchical cells may be easily adapted to existing production techniques for fabricating integrated circuit chips.

It is a still further object of the present invention to apportion, in a substantially equal manner, the excessive space for all hierarchy cells even when multiple instances of the same cells occur at the same or different levels of the hierarchy.

SUMMARY OF THE INVENTION

The present invention is directed to a method of apportioning excessive areas of an integrated circuit so that the fractional change in the percentage occupancy of all hierarchical cells is substantially the same.

The method apportions increased spaces of an integrated circuit chip representative of a growth factor F. The chip comprises a hierarchy of D levels of cells, with each cell having a predetermined utilization factor or percentage occupancy, and each cell having predetermined X and Y dimensions. Each cell has an associated level d which is an integer ($d \geq 1$) representing the depth of the cell, with d=1 representing the top level cell in the hierarchy. Each macro cell in the hierarchy is a child (C) cell of a parent (P) cell. The hierarchy of the leaf cells defines one of two situations, with the first situation being that the leaf cells are of the same hierarchical level as each other, and the second situation being that the leaf cells are of different hierarchical levels.

For the first situation, each of the leaf cells has the same depth D, and the top level cell has growth factors in the X and Y dimensions, herein termed FX and FY respectively. The growth factors for a macro cell having a depth d, in the X and Y dimensions, herein termed PFX and PFY respectively are determined by the below expressions (1) and (2):

$$PFX = FX^{((D-d)/(D-1))} \quad (1)$$

$$PFY = FY^{((D-d)/(D-1))} \quad (2)$$

For the second situation, let the growth factor for the top level cell in the X and Y dimensions be defined as FX and FY, respectively, and let one of the leaf cells be termed, C, and define its depth as d, and let the cell of the leaf cells having the highest depth be assigned a depth d'. Let the parent (P) of leaf cell (C) have growth factors in the X and Y dimensions be termed PFX and PFY respectively. After these conditions are accomplished, the growth factors of the leaf cell (C) in the X and Y dimensions termed CFX and CFY respectively are determined by the below expressions (3) and (4):

$$CFX = PFX^{((d'-d)/(d'-d+1))} \quad (3)$$

$$CFY = PFY^{((d'-d)/(d'-d+1))} \quad (4)$$

BRIEF DESCRIPTION OF THE DRAWINGS

FIG. 8 is composed of FIGS. 8(A), 8(B), 8(C) and 8(D) each illustrating cells having various non-rectangular shapes all accommodated by the practice of the present invention.

FIG. 9 is composed of FIGS. 9(A), 9(B) and 9(C), wherein FIG. 9(A) illustrates the cell of FIG. 8(A) being transformed by the steps illustrated in FIGS. 9(B) and 9(C) so that it experiences a growth factor of 1.5 in both the X and Y dimensions.

DETAILED DESCRIPTION OF THE PREFERRED EMBODIMENTS

The present invention is primarily related to a method that becomes effectual after the initial floorplanning process for the fabrication of an integrated circuit has been accomplished. More particularly, the present invention provides a method of apportioning any excessive area among the hierarchical cells of an integrated circuit chip that may have been freed-up after the initial floorplanning process because of the changes in the placement of functional elements or changes in wiring of the interconnections of the functional elements thereof. These changes may create extra area on the integrated circuit chip that needs to be equally distributed among all the macro cells of all of the hierarchical levels of the integrated circuit chip. The present invention provides a method which alters the sizes of the macro cells within the hierarchy levels in such a manner that the fractional change in the utilization percentage remains substantially constant among all the cells at all the hierarchy levels. Note that leaf cells are assumed to be library cells and are fixed in size, and not altered, and that depending on the needs of the design, a macro cell can be temporarily fixed in size and treated as a leaf cell. The utilization percentage is the percentage occupancy of child cells in a macro cell.

The present invention achieves the increases in the sizes, that is, the dimensions of the macro cells, based on a geometric progression technique that takes into account at least three situations. First, the method of the present invention handles a first specialized case where all the leaf cells in the hierarchy are at exactly the same hierarchy level, known as balanced hierarchy. The second situation is where different leaf cells of the hierarchy of the integrated circuit have different hierarchical levels. The third situation is where the same cell design as a child of different parent cells are used at the same or at different levels in the hierarchy and wherein the available space at one instance is desired to be increased by a certain amount while at the same time the available space for another instance of the same cell is desired to be increased by a different amount. All three situations involve cells having various shapes and/or building blocks that are accommodated by the practice of the present invention in a manner as to be described in more detail hereinafter. The first situation may be further described with reference to FIG. 6 which is representative of a balanced hierarchy.

Figure 3:
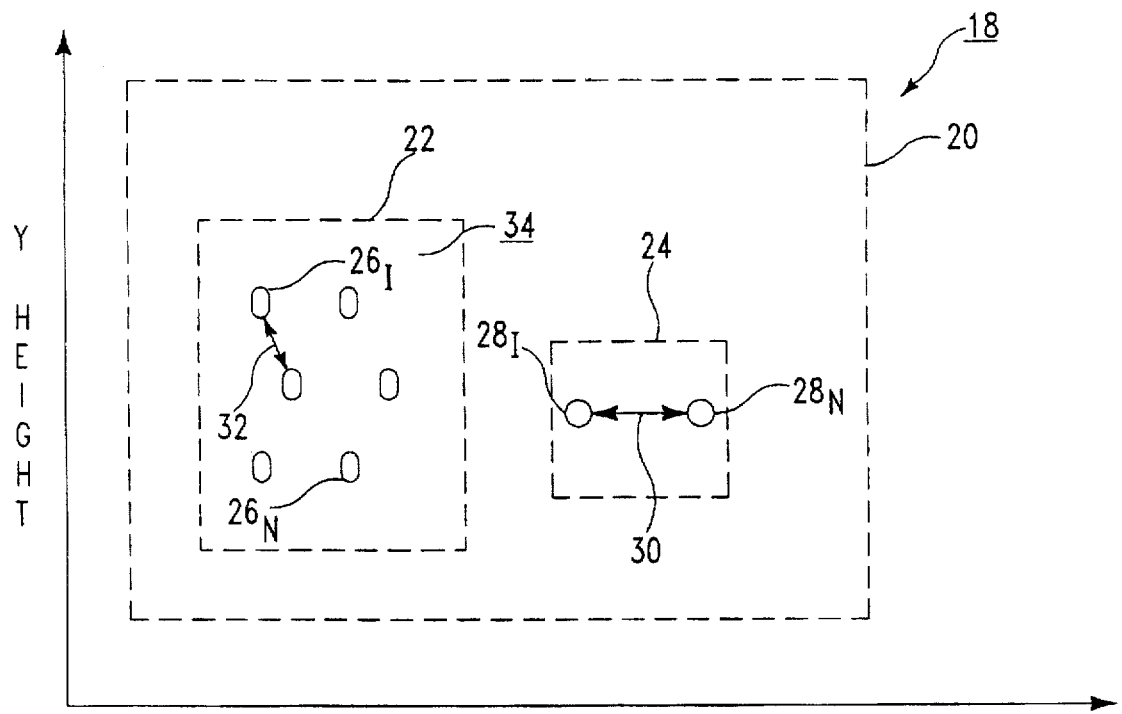
FIG. 3 illustrates an original design area on one of the hierarchial levels of an integrated circuit chip before it experiences an increase in its area.
Figure 4:
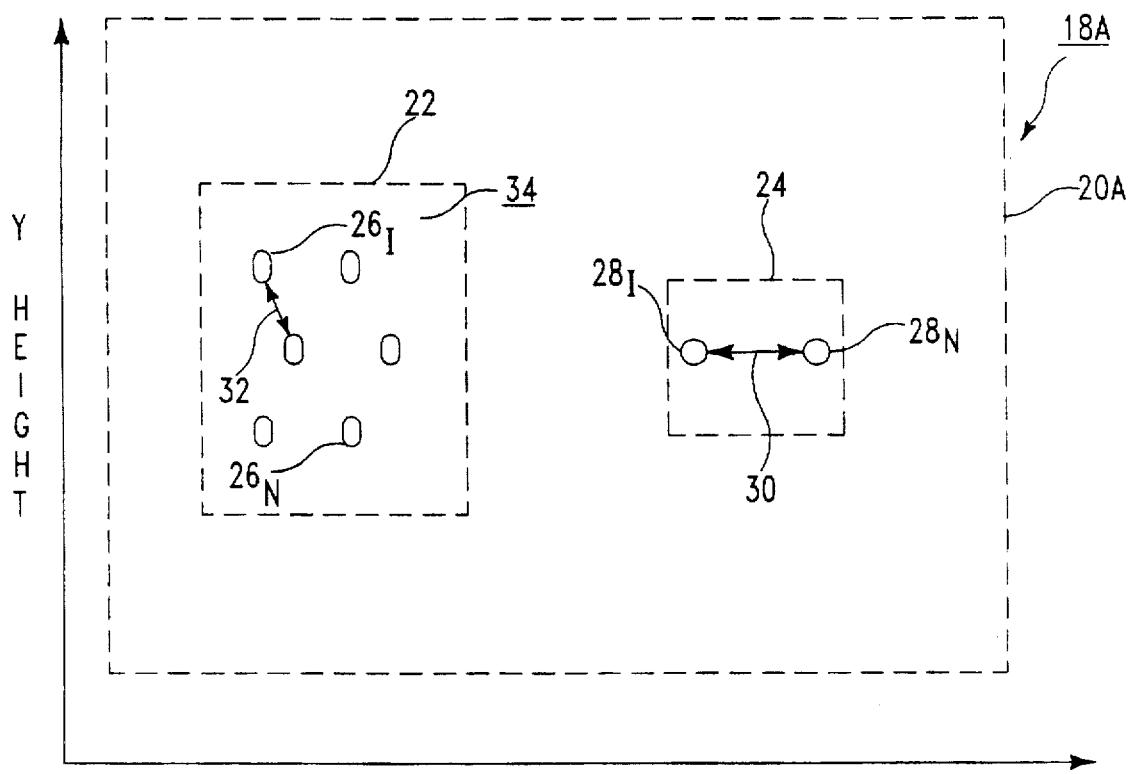
FIG. 4 illustrates the macro and library cells of FIG. 3 situated in a chip area that is increased relative to that of FIG. 3, but with the increased area not being effectively utilized.
Figure 5:
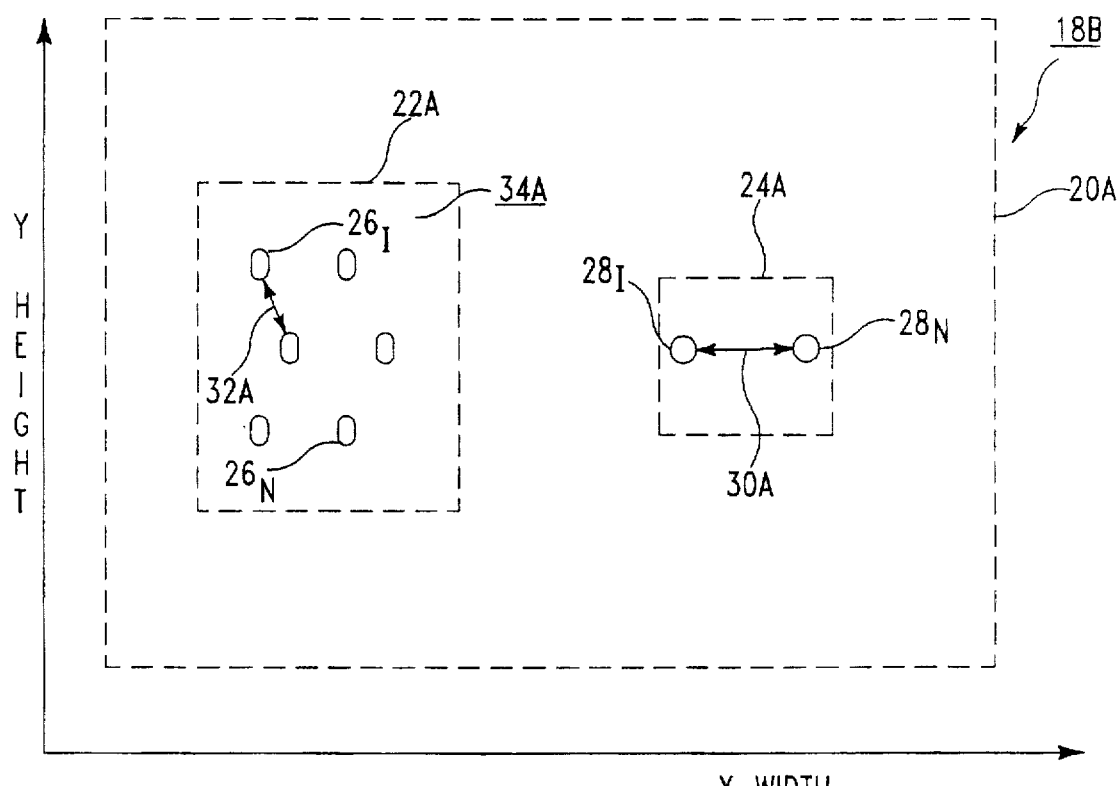
FIG. 5 illustrates the macro and library cells of FIG. 3 having their assigned increased area advantageously and efficiently utilized.
Figure 6:
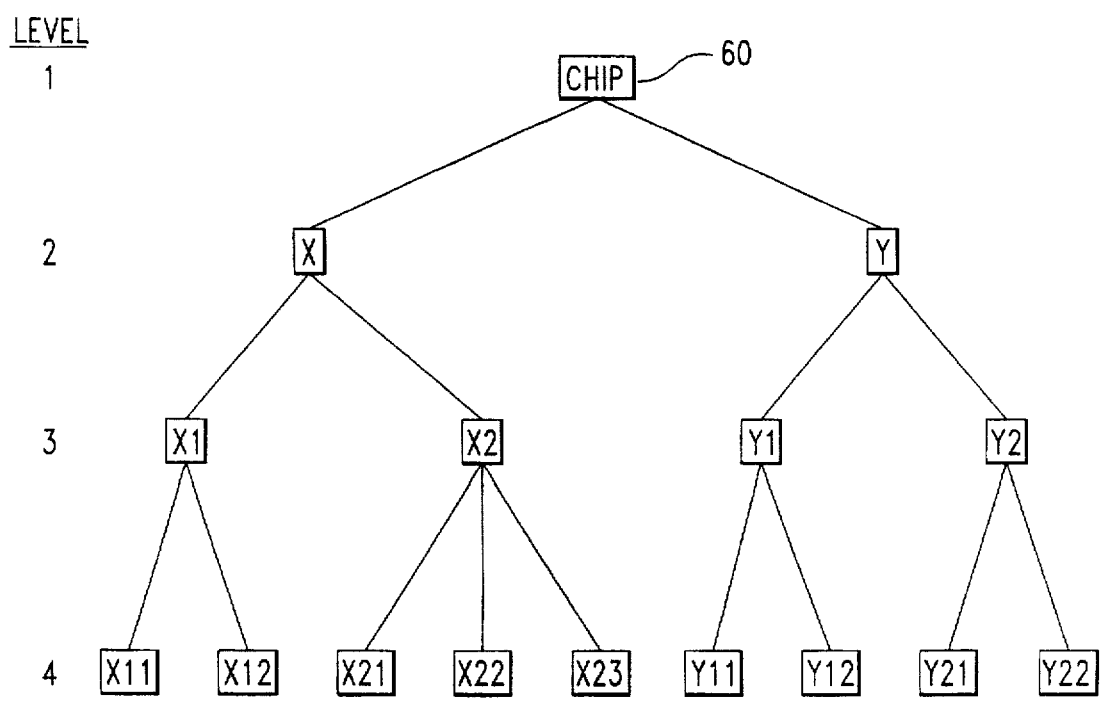
FIG. 6 illustrates a balanced hierarchy.

In FIG. 6, the integrated circuit chip 60 is considered to be at the uppermost level, that is level 1, and the macros are at intermediate levels, e.g., macro cells X and Y are considered to be at level 2, and macro cells X1, X2, Y1, and Y2 are at level 3. Leaf cells are the remaining cells, which are at level 4 in this example. With regard to a fractional increase in the dimensions of the top-level cell, such as that revealed from a comparison between FIGS. 3 and 5, and such as that occurring after the initial floorplanning process, the fractional increases that need to be blended into a new chip image are herein termed FX, FY in the X and Y dimensions, respectively. Further, the level of a cell in the integrated chip may be represented by a depth (d) defined as the number of hierarchical levels between the top-level cell (chip 60) and the cell, both levels being included therein. Thus, the top-level cell, that is the integrated chip 60 has a depth d=1 by definition. It is common that each macro cell, e.g., X or X1, has a single parent as shown in FIG. 6, but the practice of the present invention is also applicable to macro cells that are used in a multiple manner at different locales in the hierarchy tree that may imply conflicting size constraints or requirements as will be described hereinafter with reference to the previously mentioned third situation.

As seen in FIG. 6, all the leaf cells X11, X12, X21, X2, X23, Y11, Y12, Y21, and Y22 have the same hierarchy level or same depth level D; here D=4. In such a situation, all the macro cells at a given level have the same growth factor. For such a consideration, the growth factors PFX and PFY for a macro cell may be respectively represented by the below expressions 1 and 2:

$$PFX = FX^{((D-d)/(D-1))} \quad (1)$$

$$PFY = FY^{((D-d)/(D-1))} \quad (2)$$

where FX and FY are the growth factors for the top level of the hierarchy (i.e. the chip).

For this example, consider macro cell X with a depth d=2. Further let FX=FY=1.5. Note that FX and FY may differ, but are equal for this example. Thus PFX for X1 (growth factor for cell X) is $1.5^{((4-2)/(4-1))}$ or $1.5^{2/3}$. Likewise PFY is $1.5^{2/3}$. Similarly, for macro cell X1, again D=4, but d=3. Thus PFX=PFY=$1.5^{((4-3/4-1))}$ or $1.5^{1/3}$.

It should now be appreciated that the practice of the present invention provides for a method wherein any excess space related to leaf cells having the same hierarchical level is apportioned therebetween in a substantially equal manner so as to alter the utilization factor of all the macro cells at all the hierarchy levels by substantially the same factor.

Figure 1:
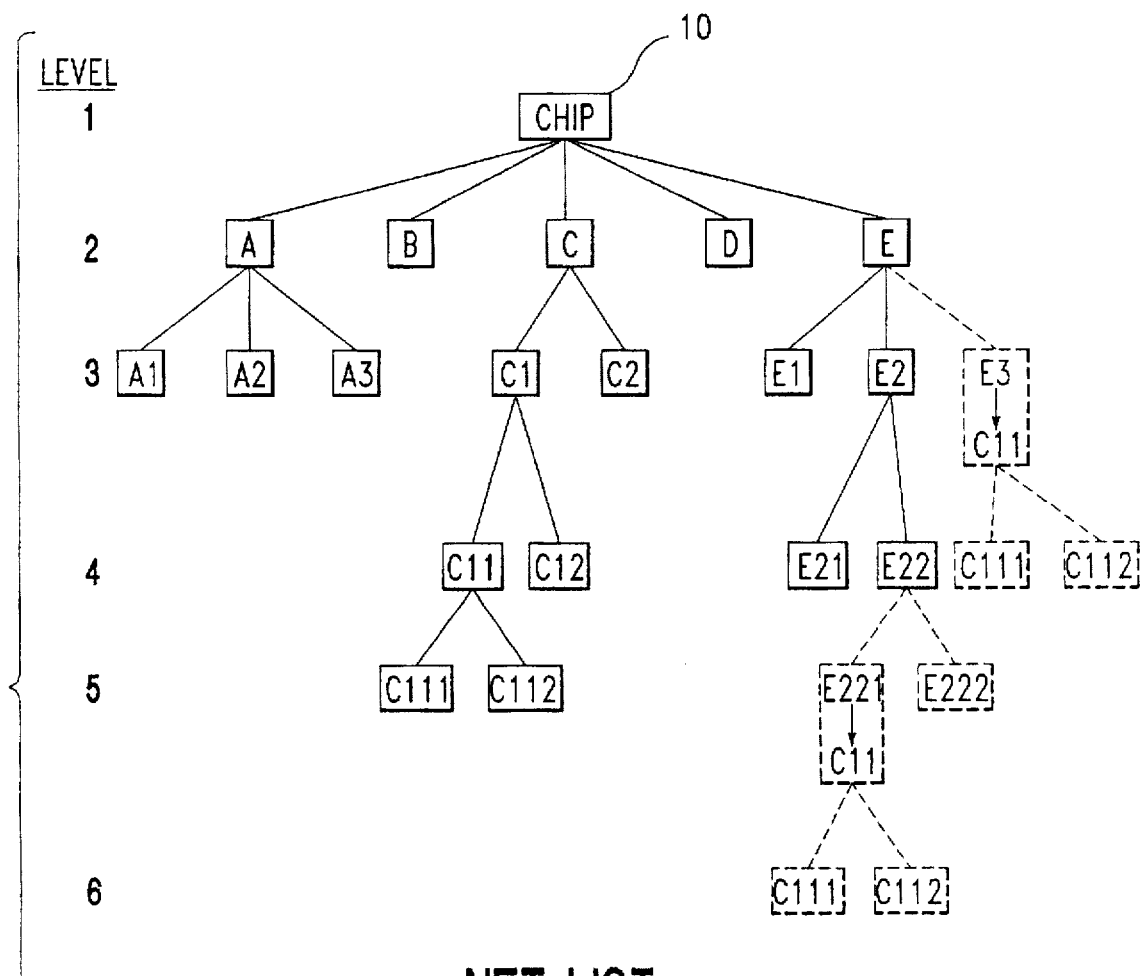
FIG. 1 illustrates an example of a hierarchy of a chip, as well as the net list of interconnections among the leaf cells of the illustrated hierarchy.

The present invention is equally applicable to altering the utilization factor by a substantially constant factor for cells in different branches of the hierarchy having different numbers of levels, such as those shown in FIG. 1. For such a situation, the macro cells, such as macro cell A immediately under the chip 10, have growth factors that are computed for each one of the cells depending on how many hierarchical levels lie under the cell, such as cell A having leaf cells A1, A2 and A3 lying under it. The method of altering the utilization factor for cells in different branches having different numbers of levels may be generally described with reference to the flow chart of FIG. 7 composed of FIGS. 7(A) and 7(B), wherein FIG. 7(A) comprises process segment 36 and FIG. 7(B) comprises process segments 38, 40, 42 and 44 that are respectively interconnected by paths 46, 48 and 50.

Figures 7A, 7B:
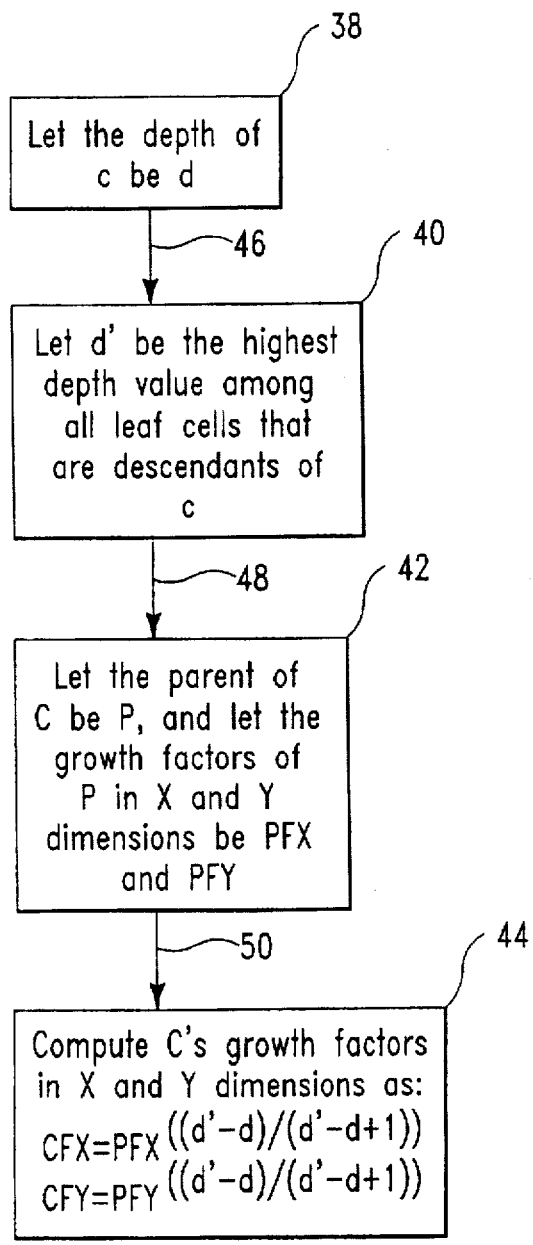
FIG. 7 is composed of FIGS. 7(A) and 7(B) that represent the steps involved in determining the growth factor of macro cells located at different hierarchical levels.

FIG. 7(A) illustrates that a simple multiplication is used to determine the growth factors of the top level cell, such as cell 10 of FIG. 1. More particularly, multiply the width and height of the top level cell (such as chip 10 of FIG. 1) by the growth factor FX and FY and the determination of such is complete. For each cell in the hierarchy, more particularly, for each cell in each branch of the hierarchy, the step-by-step procedure of the flow-chart of FIG. 7(B) needs to be followed.

FIG. 7(B) illustrates segments 38, 40, 42 and 44, each of which is performed on each of the cells in each of the branches of the hierarchy transversing in a top-down geometric progression. The cell for which the segments 38, 40, 42 and 44 is to be performed is termed C. The first segment 38 lets the depth of C be d. The second segment 40 lets d' be the highest depth value among all leaf cells that are descendants of C, that is, contained in the portion (branch) of the hierarchy rooted at C. The third segment 42 lets the parent of C be termed "P," and let the growth factors of P, in the X and Y dimensions, be PFX and PFY. It should be noted that because the top-down transversal needs to be followed for FIG. 7(B), before the determination of the growth factors for the child (C) is initiated, the growth factors of the parent (P) PFX and PFY are already computed. The fourth segment 44 computes the growth factors, termed CFX and CFY, in the X and Y dimensions, respectively, by means of expressions (3) and (4) given below:

$$CFX = PFX^{((d'-d)/(d'-d+1))} \quad (3)$$

$$CFY = PFY^{((d'-d)/(d'-d+1))} \quad (4)$$

The application of these formulas to the branch of FIG. 1 consisting of Chip 10, macro cells C, C1, C11, and leaf cells C2, C12, C111, C112 proceeds accordingly as follows, without considering reuse (i.e. assume the phantom cells do not exist in FIG. 1). First, consider macro cell C: d=2 (depth of cell C) and d'=5 (highest depth among all leaf cells that are descendants of C). Let PFX=PFY=1.5 for cell 10 for simplicity. Thus CFX for C (growth factor in the X direction for cell C) is $1.5^{((5-2)/(5-2+1))}$ or $1.5^{3/4}$. CFY is the same. Next, consider macro cell C1: d=3 and d'=5. Thus CFX and CFY for C1 are $1.5^{(3/4) \, ((5-3)/(5-3+1))}$ or $1.5^{1/2}$. Likewise, for macro cell C11, d=4 and d'=5 so CFX and CFY are $1.5^{1/4}$. As previously stated, the size of the leaf cells does not change. Note that formulas (3) and (4) can be used with a balanced hierarchy as well, and will simplify to formulas (1) and (2) when all the leaf cells of the hierarchy have the same depth.

The method of the present invention ensures that in every branch of the hierarchy, the relative growth of the parent, with respect to its children, is commensurate with the number of hierarchical levels in that branch. Hence the utilization percentages of all hierarchical cells throughout the hierarchy are increased in a way that is substantially uniform.

It should now be appreciated that the practice of the present invention provides a method that apportions, in a substantially uniform manner, the excessive area to all hierarchical cells even those of different levels or depths in an integrated circuit chip.

The method of the present invention is further applicable to the previously mentioned third situation, wherein the same macro cells are used at different levels in the hierarchy but have different resizing requirements. These macro cells that are used at multiple and different locales in the hierarchy tree imply conflicting size constraints or requirements. This third situation may be envisioned with reference to FIG. 1, wherein leaf cells C111 and C112 having cell C11 as their parent are shown three times (two in phantom) under three parent cells C1, E and E22 which happen to be at different level with depths 4, 5 and 6. These three different uses are sometimes referred to as "reuse" of the same cell design as multiple instances. For such reuse applications an orderly method is followed to resolve any apparent conflicts.

First, all of the reuse applications are identified, and the resizing of each macro is calculated according to expressions (1) and (2) or (3) and (4) above as normal. This will often result in conflicting growth factors among the different instances of the reused cells in the hierarchy. To resolve conflicts, the growth factor used for each instance of the reused cell is fixed at the most restrictive growth factor among the calculated values, which will result in the least expansion of the reused cell in the final design. Note that if the minimum growth factor among those calculated for the reused cell is chosen, no conflicts will result. However, a better solution may be arrived at by choosing a growth factor greater than the minimum, but potential conflicts must be considered. If more than one cell is being reused, then the hierarchy may need to be reevaluated and growth factors adjusted in a recursive manner after each reused cell is fixed according to the above procedure.

It should now be appreciated that the present invention provide a method for resizing cells even when the macro cells used at multiple and different locales in the hierarchy tree have conflicting size constraints.

In addition to apportioning, in a substantially equal manner, excess area to all hierarchical cells, the present invention allows the original floorplan of the integrated chip to be preserved by a simple transformation of the original X and Y coordinates of the cells in the hierarchy. More particularly, to preserve the original floorplan, for each cell in the hierarchy, multiply its location coordinates, with respect to the origin of the parent cell, by the growth factors of its parent cell. This simple transformation is provided because in effect, the child cells under a parent are spread out as if the child cells are pinned to a rubber sheet that corresponds to the parent cell. Since the growth factor of a child cell is guaranteed to be lower than that of the parent, there will never be overlaps or overhangs among the child cells and the parent cell. This simple transformation is based on the assumption that the image size or area of the chip being expanded takes the shape of a rectangle, such as the rectangle 20A, 22A and 24A of FIG. 5. This is not always true, and the practice of the present invention accommodates for various shapes in a manner as may be further described with reference to FIGS. 8 and 9.

Figure 2A:
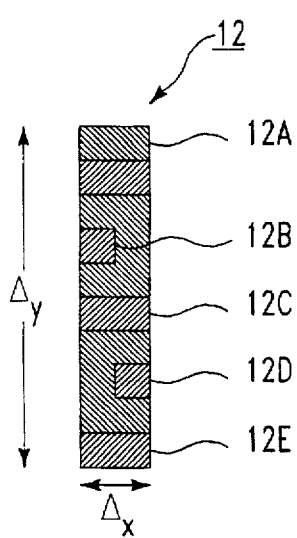
FIG. 2 is composed of FIGS. 2(A), 2(B) and 2(C) that respectively illustrates a building block commonly used in standardized chip design, and first and second possible arrays formed by the building block of FIG. 2(A).
Figure 2B:
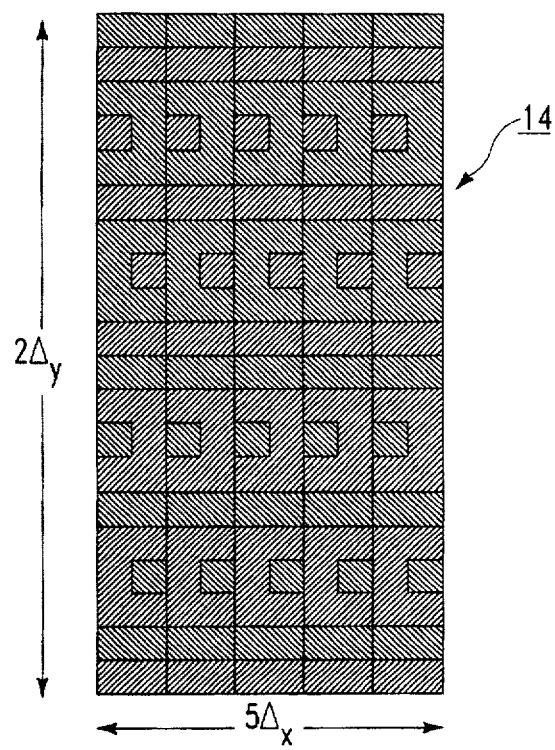
Figure 2C:
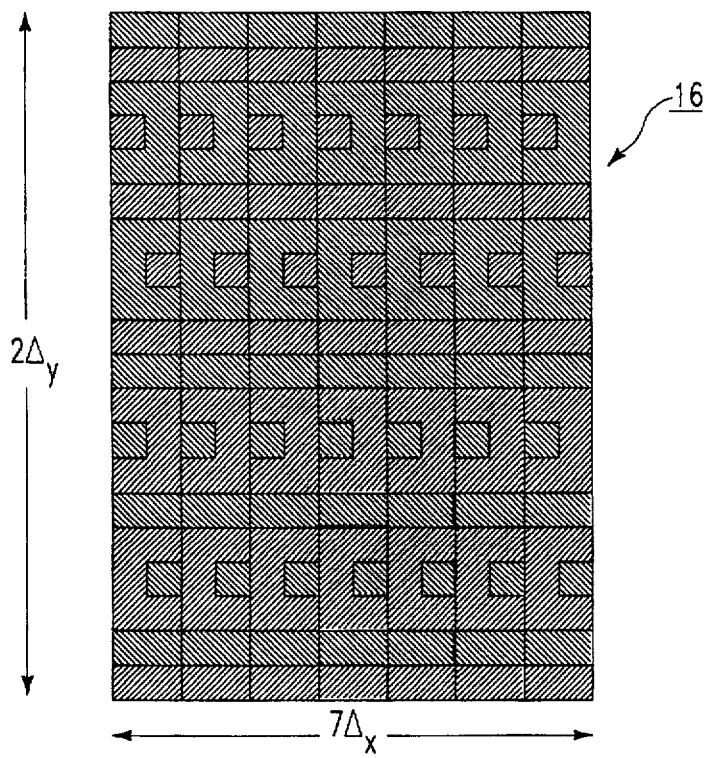

FIG. 8 is composed of FIGS. 8(A), 8(B), 8(C) and 8(D) that respectively illustrate cells 52, 54, 56 and 58 each having a non-rectangle shape. Each of cells 52, 54, 56 and 58 is illustrated as a shaded area which comprises building blocks, such as building block 12 of FIG. 2 (A). Each of cells 52, 54, 56, and 58 has region(s) devoid of any element or building block indicated by clear areas 54A, 54B, 54C, 56A, 58A, and 58B. As further seen in FIG. 8, the clear areas (except for area 58B) of each the cells 52, 54, 56 and 58 have their outer dimensions shown in phantom. These outer dimensions should be taken into account so that the cells 52, 54, 56 and 58 do not abut against or overlap with adjacent cells involved in the chip design. The transformation involved in the present invention for all of non-rectangle cells may be further described with reference to FIG. 9.

FIG. 9 is composed of FIGS. 9(A), 9(B), and 9(C), wherein FIG. 9(A) illustrates the cell 52 having the region 52A of FIG. 8(A), and FIGS. 9(B) and 9(C), each, as well as FIG. 9(A), showing an origin (0) at the lowermost left corner thereof, illustrates the steps involved in increasing the area of cell 52 so that it experiences a growth factors of CFX=1.5 and CFY=1.5, previously described with reference to expressions (3) and (4).

As seen in FIG. 9(B), the cumulative area of cell 52 along with its region 52A is shown as region 60. From the region 60, a line 62 is extended from the lower portion (X dimension) and defines a point 76 which represents the increase in area in the X dimension by the factor CFX=1.5. As further seen in FIG. 9(B), two lines 64 and 66, shown as directional arrows, are extended and respectively define points 68 and 70. The overall region of cell 52 that needs to be considered, especially for non-overlapping purposes with other cells, receiving a growth factor of CFX=1.5 and CFY=1.5, is defined by lines 62, 72, 74, and 64 and region 60. This overall defined region needs to be reduced so as to accommodate for the unused portion 52A, and such reduction may be further described with reference to FIG. 9(C).

A comparison between FIGS. 9(C) and 9(B) reveals that a set of new points 78, 80 and 82, respectively defined by directional arrows 84, 86 and 88, have been added to FIG. 9(C). Directional arrows 84, 86, and 88 represent growth factors of CFX=CFY=1.5 from region 52, i.e. arrows 84, 86, and 88 represent a 50% increase in distance from the origin 0 beyond the corners of region 52.

It should now be appreciated that the present invention provides a method of accommodating increases in the available space for all cells including those having rectangular and non-rectangular shapes. Furthermore, the practice of this invention applies to various shapes by following appropriate geometric rules, in a manner similar to that described with reference to FIGS. 8 and 9.

It should now be appreciated that the present invention provides a method that completely accommodates the relatively simple and relatively complicated integration of any excess space into all of the hierarchical cells of an integrated circuit chip so that the utilization factor of all cells is increased by a fraction that is substantially constant.

It should also be appreciated that the present invention provides a program storage device readable by a machine, tangibly embodying a program of instructions executable by the machine to perform the method steps described.

What we claim is:

1. A method of apportioning increased area of a parent cell to child macro cells of a hierarchical integrated circuit design, comprising the steps of:

a) determining parent growth factors in X and Y directions for the parent cell;

b) determining child growth factors in X and Y directions for the child cell according to a geometric progression based on the growth factors of the parent cell.

2. The method of claim 1 wherein the child growth factors are determined according to the formulas:

$$CFX = PFX^{((d'-d)/(d'-d+1))} \quad (1)$$

$$CFY = PFY^{((d'-d)/(d'-d+1))} \quad (2)$$

where

CFX=growth factor in the X direction for the child cell;

PFX=growth factor in the X direction for the parent cell;

CFY=growth factor in the Y direction for the child cell;

PFY=growth factor in the Y direction for the parent cell;

d'=highest depth value among all leaf cells that are descendants of the child macro cell; and d=depth in the hierarchy of the child macro cell.

3. The method of claim 1 wherein the hierarchy has a top level cell, macro cells, and leaf cells with all the leaf cells having the same depth, and the child growth factors are determined according to the formulas:

$$CFX = FX^{((D-d)/(d-1))} \quad (1)$$

$$CFY = FY^{((D-d)/(D-1))} \quad (2)$$

where

CFX=growth factor in the X direction for the child cell;

FX=growth factor in the X direction for the top level cell;

CFY=growth factor in the Y direction for the child cell;

FY=growth factor in the Y direction for the top level cell;

D=depth of the leaf cells; and d=depth in the hierarchy of the child macro cell.

4. The method of claim 1 wherein a child macro cell is reused, further comprising the steps of:

(c) identifying all instances of reuse;

(d) fixing the growth factor of the reused child macro cell as the most restrictive of all the determined growth factors for each instance of reuse according to steps (a) and (b).

5. The method of claim 4 wherein more than one child macro cell is reused, further comprising:

(e) reevaluating and adjusting as necessary the growth factors for the hierarchy in a recursive manner after the growth factor for each reused child macro cell is fixed.

6. The method of claim 1 wherein the parent cell is non-rectangular.

7. The method of claim 1 wherein the parent cell is rectangular.

8. A program storage device readable by a machine, tangibly embodying a program of instructions executable by the machine to perform the method steps for apportioning increased area of a parent cell to child macro cells of a hierarchical integrated circuit design, said method steps comprising:

a) determining parent growth factors in X and Y directions for the parent cell;
   b) determining child growth factors in X and Y directions for the child cell according to a geometric progression based on the growth factors of the parent cell.

9. The program storage device of claim 8 wherein the child growth factors are determined according to the formulas:

$$CFX = PFX^{((d'-d)/(d'-d+1))} \quad (1)$$

$$CFY = PFY^{((d'-d)/(d'-d+1))} \quad (2)$$

where

CFX=growth factor in the X direction for the child cell;
PFX=growth factor in the X direction for the parent cell;
CFY=growth factor in the Y direction for the child cell;
PFY=growth factor in the Y direction for the parent cell;
d'=highest depth value among all leaf cells that are descendants of the child macro cell; and
d=depth in the hierarchy of the child macro cell.

10. The program storage device of claim 8 wherein the hierarchy has a top level cell, macro cells, and leaf cells with all the leaf cells having the same depth, and the child growth factors are determined according to the formulas:

$$CFX = FX^{((D-d)/(D-1))} \quad (1)$$

$$CFY = FY^{((D-d)/(D-1))} \quad (2)$$

where

CFX=growth factor in the X direction for the child cell;
FX=growth factor in the X direction for the top level cell;
CFY=growth factor in the Y direction for the child cell;
FY=growth factor in the Y direction for the top level cell;
D=depth of the leaf cells; and
d=depth in the hierarchy of the child macro cell.

11. The program storage device of claim 8 wherein a child macro cell is reused, further comprising the steps of:

(c) identifying all instances of reuse;
   (d) fixing the growth factor of the reused child macro cell as the minimum of all the determined growth factors for each instance of reuse according to steps (a) and (b).

12. The program storage device of claim 8 wherein more than one child macro cell is reused, further comprising:

(e) reevaluating and adjusting as necessary the growth factors for the hierarchy in a recursive manner after the growth factor for each reused child macro cell is fixed.

13. The program storage device of claim 8 wherein the parent cell is non-rectangular.

14. The program storage device of claim 8 wherein the parent cell is rectangular.

* * * * *